(12) United States Patent
Spanke et al.

(10) Patent No.: US 9,903,909 B2
(45) Date of Patent: Feb. 27, 2018

(54) PROCESS MEASURING DEVICE FOR A MEASURING AND CONTROL TECHNOLOGY

(75) Inventors: Dietmar Spanke, Steinen (DE); Herbert Schroth, Schopfheim (DE); Manfred Hammer, Wehr (DE)

(73) Assignee: ENDRESS + HAUSER GMBH + CO. KG, Maulburg (DE)

( * ) Notice: Subject to any disclaimer, the term of this patent is extended or adjusted under 35 U.S.C. 154(b) by 1278 days.

(21) Appl. No.: 12/312,434

(22) PCT Filed: Oct. 15, 2007

(86) PCT No.: PCT/EP2007/060965
§ 371 (c)(1),
(2), (4) Date: Jan. 13, 2010

(87) PCT Pub. No.: WO2008/055759
PCT Pub. Date: May 15, 2008

(65) Prior Publication Data
US 2010/0110610 A1    May 6, 2010

(51) Int. Cl.
*G01R 31/28* (2006.01)
*H05K 10/00* (2006.01)
*F16D 66/00* (2006.01)

(52) U.S. Cl.
CPC ................. *G01R 31/2849* (2013.01)

(58) Field of Classification Search
USPC ........................................................ 361/437
See application file for complete search history.

(56) References Cited

U.S. PATENT DOCUMENTS

| | | | |
|---|---|---|---|
| 5,668,529 A | | 9/1997 | Kyrtsos |
| 5,864,241 A | * | 1/1999 | Schreck ................. G01N 17/00 324/210 |
| 7,035,050 B1 | * | 4/2006 | Kulangara ................. 360/245.9 |
| 7,172,144 B1 | * | 2/2007 | Slater et al. ................ 241/101.2 |
| 2005/0046985 A1 | * | 3/2005 | Morinaga ............ G11B 5/3136 360/31 |

(Continued)

FOREIGN PATENT DOCUMENTS

| | | |
|---|---|---|
| DE | 29 10 587 | 9/1980 |
| DE | 100 34 443 A1 | 1/2002 |

(Continued)

*Primary Examiner* — Thienvu Tran
*Assistant Examiner* — Nicolas Bellido
(74) *Attorney, Agent, or Firm* — Bacon & Thomas, PLLC

(57) ABSTRACT

An electronic device including electronics arranged in an electronics compartment and having electronic and/or electromechanical components. The device automatically detects and/or monitors wear of its electronic and/or electromechanical components and includes an apparatus for detecting and/or monitoring wear of the electronic and/or electromechanical components. Included is at least one element arranged in the electronics compartment. This element is independent of the electronics and has at least one physical property, which changes irreversibly as a function of wear of the element. The apparatus further includes a circuit for measuring the physical property, and an evaluating unit, which, based on the measured physical property, detects and/or monitors wear of the element and makes available a wear-dependent output signal.

5 Claims, 2 Drawing Sheets

(56) References Cited

U.S. PATENT DOCUMENTS

2005/0157597 A1* 7/2005 Sendur .................. B82Y 10/00
369/13.55

FOREIGN PATENT DOCUMENTS

| | | |
|---|---|---|
| DE | 103 45 183 A1 | 4/2005 |
| EP | 0 193 732 B1 | 9/1986 |
| JP | 7 -163045 | 6/1995 |
| JP | 07163045 A | 6/1995 |
| JP | 11-174130 | 7/1999 |
| JP | 2000-323812 | 11/2000 |
| JP | 2008-36543 | 2/2008 |
| RU | 53 990 U1 | 11/2005 |
| SU | 116 92 06 A | 7/1985 |
| WO | WO 2006/079690 A1 | 8/2006 |

* cited by examiner

PROCESS MEASURING DEVICE FOR A MEASURING AND CONTROL TECHNOLOGY

TECHNICAL FIELD

The invention relates to an electronic device including electronics arranged in an electronics compartment and having electronic and/or electromechanical components.

BACKGROUND DISCUSSION

In measuring- and control-technology, today, a large number of electronic devices are in use. Especially, measuring devices, such as e.g. those measuring pressure, temperature, flow, e.g. flow rate, and/or fill level, are applied for checking, control and/or automating of complex processes. Such electronic devices usually have one or a plurality of electronics arranged in an electronics compartment. Such electronics typically include a plurality of electronic and/or electromechanical components.

In industrial applications, these electronic devices are frequently subjected to very rough environmental conditions. There is, consequently, e.g. the danger, that aggressive media, especially acids or solvents, can penetrate into the electronics compartment and cause wear in the form of damage or even destruction of important electronic and/or electromechanical components. Other possible causes for wear include shocks, vibration, extreme temperatures, or even ionizing radiation.

The electronics are, as a rule, arranged in permanently closed housings and protected by potting compounds, so they are not accessible from outside without special measures. Thus, wear of the electronic and/or electromechanical components, such as can be caused e.g. by penetration of aggressive media into the electronics compartment, can be recognized from outside only when a malfunction or a total failure of the electronics arrives. This presents a large safety risk, which, as a rule, can only be avoided through regular maintenance and/or early replacement of the electronic device.

SUMMARY OF THE INVENTION

It is an object of the invention to provide an electronic device, which automatically detects and/or monitors wear of its electronic and/or electromechanical components.

To this end, the invention resides in an electronic device, including:
an electronics arranged in an electronics compartment and having electronic and/or electromechanical components; and
an apparatus for detecting and/or monitoring wear of the electronic and/or electromechanical components,
which includes, arranged in the electronics compartment and independent of the electronics, at least one element, which has at least one physical property, which changes irreversibly as a function of wear of the element,
which includes a circuit for measuring such physical property, and
which includes an evaluating unit,
which, on the basis of the measured physical property, detects and/or monitors wear of the element and makes available an output signal dependent on wear.

In a preferred embodiment, the element is arranged at an exposed position.

In a further development, the element comprises a plastic block, which is enveloped, at least partially, by a coating of base metal.

In a first embodiment, the element is a discretely constructed capacitor, and the property is a capacitance of the capacitor.

In a second embodiment, the element is a resistor.

An advantage of the invention is that the apparatus makes available an output signal dependent on wear. Therewith, an operator can detect from outside, whether wear is, or is not, present. In this way, the operator can optimize maintenance, and/or replacement, intervals. Thus, unnecessary maintenance and/or replacement of devices can be avoided without compromising safety.

BRIEF DESCRIPTION OF THE DRAWINGS

The invention and other advantages will now be explained in greater detail on the basis of the figures of the drawing, in which two examples of embodiments are presented. Equal elements are provided in the figures with equal reference characters. The figures of the drawing show as follows.

DETAILED DISCUSSION IN CONJUNCTION WITH THE DRAWINGS

Figure 1:
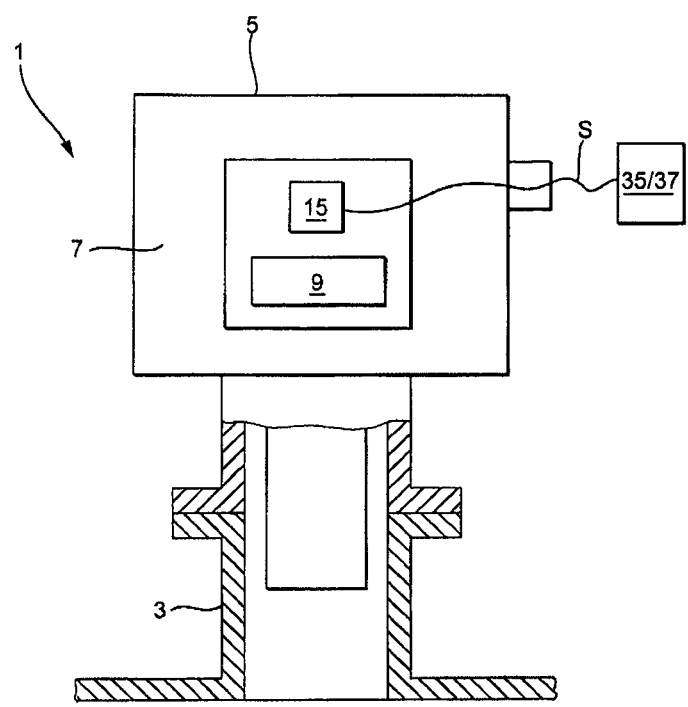
FIG. 1 a partially sectional view of an electronic device of the invention.

FIG. 1 shows a partially sectional view of an electronic device 1. In the illustrated example of an embodiment, the electronic device 1 is a measuring device, e.g. a sensor, a measuring transducer or a transmitter, which is mounted on a mounting nozzle 3 at a measuring location, e.g. on a container. Such devices are applied in a large number of applications in measuring- and control-technology, e.g. for measuring pressures, temperatures or fill levels. The invention is, however, also applicable in connection with other types of electronic devices, which have electronics arranged in an electronics compartment.

Figure 2:
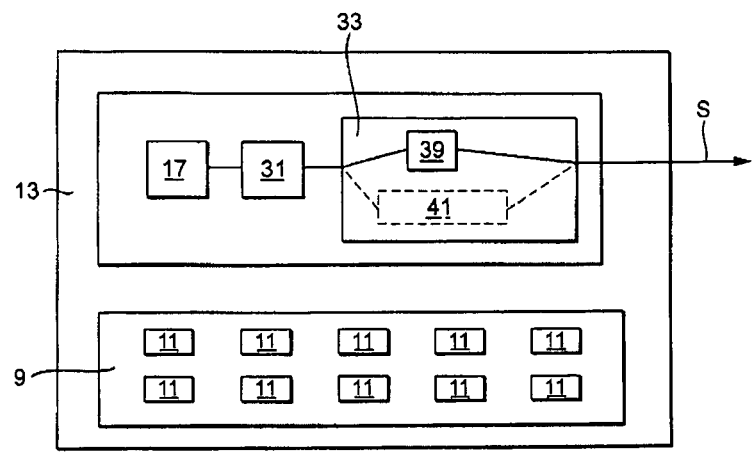
FIG. 2 a circuit board with the electronics and the apparatus for ascertaining and/or monitoring wear of the components of the electronics.

The device 1 has a housing 5. In the housing 5 is located an electronics compartment 7, in which an electronics 9 is arranged. The electronics 9 includes a plurality of electronic and/or electromechanical components 11, which are arranged, for example, such as shown in FIG. 2, on a circuit board 13. Examples of electronic components include passive components, such as resistances, capacitors, quartz oscillators and the like, as well as active components, such as transistors, microcontrollers, memory chips, liquid crystal displays and the like. Examples of electromechanical components include plug connectors, connecting cables, relays, switches, etc.

According to the invention, the electronic device 1 includes an apparatus 15 for detecting and/or monitoring wear of the electronic and/or electromechanical components 11. Wear of the electronic and/or electromechanical components 11 can be caused e.g. by aggressive media, such as e.g. acids or solvents, penetrating into the electronics compartment 7. Such media attack the electronic and/or electromechanical components 11. This leads to wear of the electronic and/or electromechanical components 11, and can lead to a degrading of the functionality of the components 11. Other possible cause for wear are, for example, high temperatures, which can lead to a premature aging of the components 11, rapid temperature fluctuations, which can lead to stress cracking, or ionizing rays, which can embrittle plastics or damage semiconductor components, as well as vibration and shock, which can lead to fracture from material fatigue. Apparatus 15 serves for detecting and/or monitoring wear brought about by factors such as described above, without it being necessary in this connection to open the electronic device 1.

Apparatus 15 includes at least one element 17 arranged in the electronics compartment 7. Element 17 is preferably arranged at an exposed position in the electronics compartment 7, so that, in given cases, aggressive media penetrating into the electronics compartment 7, ambient temperatures, ionizing rays, mechanical loads, etc. act directly on the element 17. Suitable as exposed locations are, for example, locations in the housing 5, which are not protected by further protective measures, such as e.g. covers, or potting compound. Likewise suited are locations, where the danger from penetrating medium is especially high, e.g. in the vicinity of feed-throughs through the housing 5 or in the region of seals, e.g. between parts of the housing 5 adjoining one another. Element 17 has at least one physical property, which changes irreversibly as a function of wear of the element 17. Suitable as element 17 are e.g. discretely constructed resistors or capacitors. Applicable in this connection are e.g. standard, commercially available components. Physical properties are, in such case, dependent on the choice of the element 17. Examples nameable here include wear-dependent resistance value of a resistor, or wear-dependent capacitance of a capacitor.

However, also other component types with other wear-dependent, electrical, thermal, chemical, optical, or mechanical properties can be applied in connection with the invention, such as e.g. the heat transfer resistance of a coated component to the environment, as a function of coating separation, the optical absorbance of a substance, which changes as a function of chemical reaction, or the modulus of elasticity of an electromechanical oscillator, which loses elasticity as a function of exposure to ionizing radiation.

In this way, not only wear of components by long-term action of damaging conditions can be checked, but also wear arising from conditions which do not last long but which are extreme. Thus, for example, the breaking of a conductor in the element due to mechanical or thermal overloading is taken into consideration for detecting and/or monitoring wear of the electronic device 1.

Since, in the present invention, an irreversible change of a physical property of the element 17 is utilized, which changes independently of the operating state of the electronic device 1, not only is wear detected, which occurs during operation, but, also, wear arising during transport, storage, or during downtimes.

Figure 3:
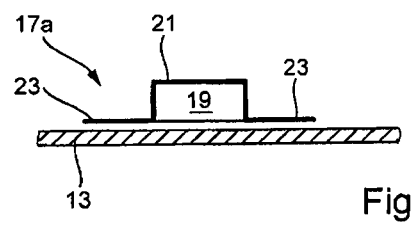
FIG. 3 a resistor arranged on the circuit board.

FIG. 3 shows a first preferred example of an embodiment of an element 17a. It comprises a resistor having a plastic block 19, e.g. of polyethylene or polystyrene. Preferably, a very simple plastic is used, which is not solvent-resistant. The block 19 is at least partially enveloped by a coating 21 of a base metal, e.g. aluminum. Serving as physical property of this element 17 is its resistance R. Such is sensed, for example, via two connections 23 located on the two ends of the coating 21.

A special advantage of element 17a lies in the fact that the resistance R changes as a function of both wear of the plastic block 19 as well as also as a function of wear of the metal coating 21. In this way, with a single element 17a, both wear caused by penetrating solvent, which attacks the plastic, as well as also that caused by penetrating acids, which attacks the metal, can be detected and/or monitored.

Figure 4:
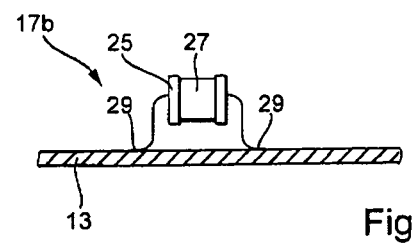
FIG. 4 a capacitor arranged on the circuit board.

FIG. 4 shows a second preferred example of an embodiment of an element 17b. It comprises a discretely built capacitor. In this example, a plate capacitor with two oppositely lying, metal capacitor plates 25 and a dielectric 27 arranged therebetween is provided. Other forms and geometries are, of course, likewise applicable. Serving as physical property of this element 17b is its capacitance C, which is sensed, for example, via two connections 29 connected to the opposing capacitor plates 25.

Also in the case of this element 17b, there is the special advantage, that the physical property of the element 17b, here its capacitance C, changes both as a function of wear of the dielectric material 27, as well as also as a function of wear of the metal capacitor plates 25. In this way, with a single element 17a, both wear from penetrating solvent, which attacks the dielectric, as also wear from penetrating acids, which attack the metal, can be detected and/or monitored.

Besides the above named wear through solvents and acids, appropriate elements 17 can also be used to detect and/or monitor other forms of wear. Thus, for example, there can be applied, for detecting and/or monitoring wear from penetrating ionizing radiation, a semiconductor as element 17, whose conductivity changes as a function of ionizing radiation acting thereon, or a field effect transistor, in the case of which the isolating resistor between gate and source changes.

Wear through aging can be detected and/or monitored, for example, by use of a capacitor having an electrolyte, which dries with time. The change of capacitance of this capacitor associated therewith is a measure for the life expectancy of the electronic components 11.

In the case of applications, in which many different causes for wear are present, naturally, a number of apparatuses 15 can be applied, or various elements 17 can be combined with one another, in that they are, for example, connected in parallel or in series, and one or a number of physical properties of the circuit built of the elements 17 are taken into consideration.

The apparatus 15 for detecting and/or monitoring wear includes a circuit 31 for measuring the physical property of the pertinent element 17. In connection with the element 17a shown in FIG. 3, such is a resistance measuring circuit connected to the connections 23. In the case of the element 17b shown in FIG. 4, such is a capacitance measuring circuit connected to the connections 29. Such circuits are sufficiently known and, consequently, are not explained here in greater detail.

Additionally, apparatus 15 includes an evaluating unit 33, which, on the basis of the measured physical property, detects and/or monitors wear of the component and makes available an output signal S dependent on wear.

Output signal S can be fed directly to a display 35 or to a superordinated unit 37, e.g. a control room. Thus, the output signal S is accessible outside for the operator, without an opening of the electrical device 1 being needed. In this way, in very simple and cost-effective manner, it is possible to optimize maintenance intervals, without that safety compromises occur thereby.

For detecting wear, it suffices that the evaluating unit 33 have a simple comparator 39, which compares the measured physical property with a predetermined reference value. The reference value is ascertained on the basis of an output value of the physical property possessed by the element 17 before use. If, for example, the measured resistance R of the element 17a shown in FIG. 3 lies below the predetermined reference value, then no wear is present. If it exceeds the reference value, then wear is present. This is true analogously for the example of an embodiment shown in FIG. 4. If the measured capacitance of the element 17b shown in FIG. 4 lies above a predetermined reference value, then no wear is present. If it sinks below the reference value, then wear is present. The output signal of the comparator 39 can be used directly as output signal S.

If, additionally, a monitoring of wear is desired, then the evaluating unit 33 includes, preferably, a signal processing unit 41, e.g. a microcontroller, which ascertains time behavior of the measured physical properties. This variant is shown in FIG. 2 by a dashed line representation. There, for example, the measured physical properties are stored together with the point in time, at which they were measured, over a period of time. Also, here, preferably, the reference value described already in connection with the detecting of wear is applied. Preferably, on the basis of the time behavior of the physical properties, it is calculated, for example through extrapolation, when a subceeding, or falling beneath, or an exceeding, of the reference value is to be expected. Used as output signal S, here, is, for example, a signal showing the remaining time until the reaching of the expected wear. Output signal S is accessible from outside and provides the operator with the opportunity for long-term planning of maintenance intervals, or, in given cases, of required replacement of the device 1.

An advantage of the invention is that the device 1 automatically detects, whether wear is present. In this way, maintenance and/or replacement of the device 1 are/is optimized. Unnecessary maintenance and replacements are avoided.

The invention claimed is:

1. A process measuring device for a measuring- and control-technology, which is mounted on a container, comprising:
   a housing;
   electronics arranged in an electronics compartment in said housing and having a plurality of electronic and/or electromechanical components; and
   an apparatus for detecting and/or monitoring wear of said electronic and/or electromechanical components caused by aggressive media penetrating into the electronics compartment and/or high temperatures and/or rapid temperature fluctuations and/or ionizing rays and/or vibration and/or shock, said apparatus includes at least one element, arranged in said electronics compartment in said housing and independent of said electronics, wherein:
   said at least one element has at least one physical property, which changes irreversibly as a function of wear of said element, and independently of an operating state of the electronics;
   said apparatus further includes a circuit for measuring said at least one physical property, and an evaluating unit;
   based on the measured physical property, said evaluating unit detects and/or monitors wear of said element and makes available a wear-dependent output signal,
   said output signal being fed directly to a display or a control room so that the output signal is accessible outside for an operator, without an opening of the measuring device being needed; and
   said output signal provides an operator with the opportunity for long-term planning of maintenance intervals, or, in given cases, of required replacement of the process measuring device.

2. The process measuring device as claimed in claim 1, wherein:
   said at least one element is arranged at an exposed position.

3. The process measuring device as claimed in claim 1, wherein:
   said at least one element includes a plastic block, which is enveloped, at least partially, by a coating of base metal.

4. The process measuring device as claimed in claim 1, wherein:
   said at least one element is a discretely constructed capacitor, and the property is a capacitance of the capacitor.

5. The process measuring device as claimed in claim 1, wherein:
   said at least one element is a resistor.

* * * * *